(12) United States Patent
Asai

(10) Patent No.: US 9,862,072 B2
(45) Date of Patent: Jan. 9, 2018

(54) DOUBLE-SIDE POLISHING METHOD

(71) Applicant: SHIN-ETSU HANDOTAI CO., LTD., Tokyo (JP)

(72) Inventor: Kazumasa Asai, Nagano (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 321 days.

(21) Appl. No.: 14/425,607

(22) PCT Filed: Oct. 21, 2013

(86) PCT No.: PCT/JP2013/006204
§ 371 (c)(1),
(2) Date: Mar. 3, 2015

(87) PCT Pub. No.: WO2014/076880
PCT Pub. Date: May 22, 2014

(65) Prior Publication Data
US 2015/0209931 A1 Jul. 30, 2015

(30) Foreign Application Priority Data

Nov. 13, 2012 (JP) ................................. 2012-249572

(51) Int. Cl.
*B24B 49/12* (2006.01)
*B24B 37/08* (2012.01)
(Continued)

(52) U.S. Cl.
CPC ............ *B24B 49/12* (2013.01); *B24B 37/005* (2013.01); *B24B 37/08* (2013.01); *B24B 49/03* (2013.01);
(Continued)

(58) Field of Classification Search
CPC ..... B24B 37/013; B24B 37/042; B24B 37/08; B24B 49/04; B24B 49/12
See application file for complete search history.

(56) References Cited

U.S. PATENT DOCUMENTS 5,609,511 A 3/1997 Moriyama et al.
5,708,506 A 1/1998 Birang
(Continued)

FOREIGN PATENT DOCUMENTS

CN 101909817 A 12/2010
CN 102089121 A 6/2011
(Continued)

OTHER PUBLICATIONS

Jun. 17, 2016 Office Action in Chinese Patent Application No. 201380047658.1.
(Continued)

*Primary Examiner* — Monica Carter
*Assistant Examiner* — Lauren Beronja
(74) *Attorney, Agent, or Firm* — Oliff PLC

(57) ABSTRACT

The invention provides a double-side polishing method including first polishing at a high polishing rate, second polishing at a low polishing rate, dividing a straight line extending between the outermost circumferences of the wafer through the center into prescribed sections, and optically measuring a cross-sectional shape of the sections; applying a weight predetermined for each section to the cross-sectional shape to quantify flatness of each section; and determining polishing conditions of the first and second polishing in subsequent polishing on a basis of the quantified flatness, wherein a beam diameter of a measurement apparatus used to measure the cross-sectional shape of outermost sections is smaller than that used to measure the cross-sectional shape of the other section. The method can mea- (Continued)

sure the shape of the wafer up to its outermost circumference with high precision without reducing productivity, and improve the flatness of the entire wafer including its outermost circumference.

20 Claims, 5 Drawing Sheets

(51) Int. Cl.
  B24B 37/005    (2012.01)
  B24B 49/03     (2006.01)
  H01L 21/02     (2006.01)
  H01L 21/66     (2006.01)
(52) U.S. Cl.
  CPC ........ *H01L 21/02024* (2013.01); *H01L 22/12* (2013.01); *H01L 22/20* (2013.01)

(56) References Cited

U.S. PATENT DOCUMENTS

| | | | |
|---|---|---|---|
| 5,964,643 A | 10/1999 | Birang et al. | |
| 2002/0076933 A1 | 6/2002 | Kawamura et al. | |
| 2009/0286332 A1* | 11/2009 | Ohta | H01L 21/67219 438/7 |
| 2011/0130073 A1* | 6/2011 | Furukawa | B24B 37/042 451/6 |
| 2011/0279822 A1* | 11/2011 | Kannaka | G01B 11/06 356/503 |
| 2013/0288575 A1* | 10/2013 | Endo | C03C 19/00 451/41 |
| 2014/0256227 A1* | 9/2014 | Aoki | H01L 22/12 451/8 |

FOREIGN PATENT DOCUMENTS

| | | |
|---|---|---|
| JP | H05177539 A | 7/1993 |
| JP | H09119822 A | 5/1997 |
| JP | 2002100594 A | 4/2002 |
| JP | 2002184733 A | 6/2002 |
| JP | 2006049740 A | 2/2006 |
| JP | 2006-095677 A | 4/2006 |
| WO | 2009088832 A1 | 7/2009 |

OTHER PUBLICATIONS

Dec. 17, 2013 International Search Report issued in International Application No. PCT/JP2013/006204.
Apr. 8, 2016 Search Report issued in Taiwanese Patent Application No. 102139361.
Feb. 7, 2017 Office Action issued in Chinese Patent Application No. 201380047658.1.

* cited by examiner

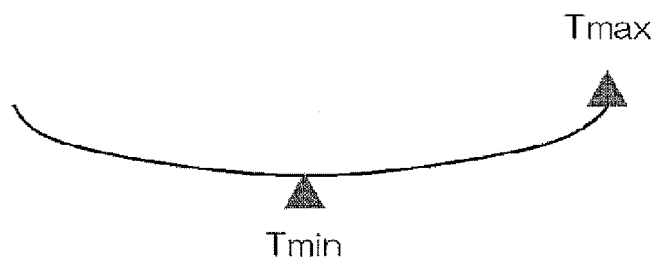

T=Tmax−Tmin=91 (nm)

| SECTION | $\Delta A_{n-1}$ | $\Delta A_{n-2}$ | $\Delta A_0$ | $\Delta A_0'$ | $\Delta A_{n-2}'$ | $\Delta A_{n-1}'$ |
|---|---|---|---|---|---|---|
| MEASURED VALUE | −20 | −21 | −43 | −48 | −18 | −25 |
| DECISION | FLAT | MINUS | MINUS | MINUS | FLAT | MINUS |
| VALUE | 0 | −0.5 | −1 | −1 | 0 | −1 |
| $\alpha, \beta$ | 0 | −1.5 (USED α) | | −1 | | −1 (USED β) |

(B)

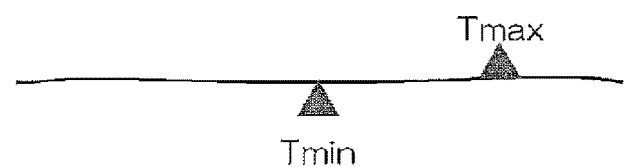

T=Tmax−Tmin=10 (nm)

| SECTION | $\Delta A_{n-1}$ | $\Delta A_{n-2}$ | $\Delta A_0$ | $\Delta A_0'$ | $\Delta A_{n-2}'$ | $\Delta A_{n-1}'$ |
|---|---|---|---|---|---|---|
| MEASURED VALUE | 8 | 6 | −3 | −10 | 8 | 7 |
| DECISION | FLAT | FLAT | FLAT | FLAT | FLAT | FLAT |
| VALUE | 0 | 0 | 0 | 0 | 0 | 0 |
| $\alpha, \beta$ | 0 | 0 | | 0 | | 0 |

DOUBLE-SIDE POLISHING METHOD

TECHNICAL FIELD

The present invention relates to a double-side polishing method of simultaneously polishing both surfaces of a wafer while a polishing agent is supplied.

BACKGROUND ART

The shrinkage of semiconductor devices increases a need for highly flat semiconductor wafers used as their substrate with improved productivity. In such circumstances, double-side polishing has been used for polishing wafers instead of conventional single-side polishing because of higher precision.

FIG. 8 shows a schematic diagram of a common double-side polishing apparatus of a planetary gear type. The double-side polishing apparatus 101 includes upper and lower turn tables. The upper turn table is movable upward and downward and can apply a load against a wafer interposed between the upper and lower turn tables by pressing the lower turn table. As shown in FIG. 8, the double-side polishing apparatus 101 includes a sun gear 107 disposed inside the lower turn table and an internal gear 108 disposed outside the lower turn table.

A carrier 105 to hold the wafer is disposed between the upper and lower turn tables, and can rotate with its outer circumference engaged with the sun gear 107 and the internal gear 108. The carrier 105 is rotated and revolved between the upper and lower turn tables according to the rotational speed of the sun gear 107 and the internal gear 108. The wafer, which is a subject to be polished, is inserted into a holding hole 106 formed in the carrier and held, so the wafer can be polished without coming off from the double-side polishing apparatus.

With regard to the planetary gear type of double-side polishing apparatus, it has been known that because the relation between the thickness of a carrier and the thickness of a polished wafer, a wafer finishing thickness, affects the flatness of the polished wafer, the flatness is controlled by adjusting the ratio of the finishing thickness to the thickness of the carrier (See Patent Document 1, for example).

In general, an improvement of the precision of flatness needs a decrease in polishing rate; an improvement of the productivity needs an increase in polishing rate. The polishing process is accordingly divided into two steps of a first polishing step and a second polishing step. The first polishing step performs rough polishing at a high polishing rate; the second polishing step performs precise polishing at a low polishing rate. In other words, the first polishing step contributes efficient polishing and the second polishing step contributes the achievement of precise flatness, so the flatness can be improved without reducing the productivity.

The finishing thickness is adjusted by changing the polishing time in the first polishing step. The above conventional method needs to finish a wafer with the optimal thickness depending on the carrier thickness to polish the wafer into a flat wafer.

CITATION LIST

Patent Literature

Patent Document 1: Japanese Unexamined Patent publication (Kokai) No. H05-177539

Patent Document 2: Japanese Unexamined Patent publication (Kokai) No. 2002-100594

SUMMARY OF INVENTION

Technical Problem

The polished wafer with the adjusted finishing thickness, however, does not necessarily have both high flatness of the entire wafer such as Global Backside Ideal Range (GBIR) and high flatness of the outer circumference such as Site Front Least Squares Range (SFQR) or Edge SFQR (ESFQR). Even when the wafer is polished with a finishing thickness so as to have a good GBIR, for example, a rise or a sag may occur at the outer circumference, thereby degrading the flatness of SFQR and ESFQR.

In recent years, the yield of latest devices is significantly affected particularly by the sag and rise occurring at the outer circumference. The flatness of the outer circumference has accordingly been more important than the flatness of the entire wafer. It is however difficult to improve the flatness of the outer circumference merely by controlling the flatness of the entire wafer. In addition, the above method using the carrier thickness as a criterion is hard to deal with variation in carrier thickness due to the wear of the carrier over time.

Patent Document 2, for example, discloses that the thickness of a gear of a carrier is configured to be thinner than a wafer holding portion of the carrier so that the flatness of the outer circumference of a wafer is improved. This method however limits the structure of a carrier, and cannot sufficiently improve the outer circumference.

The present invention was accomplished in view of the above-described problems. It is an object of the present invention to provide a double-side polishing method that can measure the shape of a polished wafer up to its outermost circumference with high precision without reducing the productivity, and improve the flatness of the entire wafer including its outermost circumference.

Solution to Problem

To achieve this object, the present invention provides a double-side polishing method comprising a polishing cycle that comprises: performing a first polishing step of carrying out a double-side polishing process at a high polishing rate, the double-side polishing process simultaneously polishing both surfaces of a wafer that is held with a carrier and interposed between polishing pads each attached on upper and lower turn tables while rotating and revolving the carrier, supplying a polishing agent, and measuring a thickness of the wafer; performing a second polishing step of carrying out the double-side polishing process at a low polishing rate, dividing a straight line extending from one outermost circumference of the polished wafer through a center of the polished wafer to the other outermost circumference into prescribed sections, and optically measuring a cross-sectional shape of the divided sections; applying a weight predetermined for each divided section to the measured cross-sectional shape to quantify flatness of each section; and determining polishing conditions of the first and second polishing steps in a subsequent polishing cycle on a basis of the quantified flatness, wherein a beam diameter of a measurement apparatus used to measure the cross-sectional shape of outermost sections is smaller than that used to measure the cross-sectional shape of the other section.

Such a double-side polishing method can measure the shape of the polished wafer up to its outermost circumference with high precision without reducing the productivity, and accurately use the measurement result in the subsequent polishing cycle to improve the flatness of the entire wafer including its outermost circumference.

The step of determining polishing conditions of the first and second polishing steps may include adjusting at least one of a polishing load, a rotational speed and a revolution speed of the carrier, and a rotational speed of the upper and lower turn tables such that the thickness of the wafer subjected to the first and second polishing steps becomes a target thicknesses.

This specific adjustment of the polishing conditions of the first and second polishing steps enables improvement in the flatness of the entire wafer including its outermost circumference in the subsequent polishing cycle.

The beam diameter of the measurement apparatus used to measure the cross-sectional shape of the outermost sections is preferably 1 mm or less.

In this manner, the shape of the outermost sections can be measured more reliably with high precision.

The cross-sectional shape is preferably measured by optical reflection interferometry with an infrared laser.

In this manner, the cross-sectional shape can be measured with higher precision.

The step of measuring the cross-sectional shape preferably includes: dividing the line such that the prescribed sections are symmetrical about the center of the wafer; calculating a difference $\Delta A$ in thickness of the wafer between at both ends of each section; comparing the difference $\Delta A$ of each section with that of the corresponding symmetrical section about the center of the wafer and determining that the difference of the corresponding sections is a larger value of absolute values of the compared differences, and the step of quantifying the flatness includes: quantifying flatness $\beta$ of an outer circumference of the wafer from the difference $\Delta A$ of the outermost sections; quantifying flatness $\alpha$ of the entire wafer except for the outer circumference by applying each weight to the difference $\Delta A$ of the corresponding section such that, as the section is closer to the center of the wafer, the weight is larger, and adding up the difference $\Delta A$ of the sections other than the outermost sections.

In this manner, the flatness can be concretely quantified from the measured cross-sectional shape, and the polishing conditions of the first and second polishing steps can readily be determined on the basis of the qualified flatness.

The flatness $\alpha$ of the entire wafer is preferably quantified in such a manner that the flatness $\alpha$ of the section closest to the center of the wafer is converted to 0 if the difference $\Delta A$ is 0, 1 or 2 if the difference $\Delta A$ is positive, −1 or −2 if the difference $\Delta A$ is negative; the flatness $\alpha$ of the other section is converted to 0 if the difference $\Delta A$ is 0, 0.5 if the difference $\Delta A$ is positive, −0.5 if the difference $\Delta A$ is negative; and the difference $\Delta A$ of each section is then added up, the flatness $\beta$ of the outer circumference of the wafer is preferably quantified in such a manner that the flatness $\beta$ is 0 if the difference $\Delta A$ is 0, 1 if the difference $\Delta A$ is positive, −1 if the difference $\Delta A$ is negative, and the step of determining polishing conditions of the first and second polishing steps preferably includes determining the target thickness of the wafer to be polished in the first polishing step to be performed in the subsequent polishing cycle by adding $\beta \times T$ to the target thickness in a current polishing cycle, and determining the target thickness of the wafer to be polished in the second polishing step to be performed in the subsequent polishing cycle by subtracting $\alpha \times T$ from the target thickness in the current polishing cycle, where T is a difference between the maximum thickness and the minimum thickness of the wafer.

In this manner, the flatness can be quantified with higher precision, and the flatness of the entire wafer including its outermost circumference can be improved more effectively.

The inventive method preferably includes blowing air to a surface of the wafer taken out of the carrier.

Such a method can measure the cross-sectional shape with higher precision.

Advantageous Effects of Invention

The inventive double-side polishing method includes a step of measuring the cross-sectional shape of a polished wafer, in which a straight line extending from one outermost circumference of the wafer through the center of the wafer to the other outermost circumference is divided into prescribed sections to measure the cross-sectional shape, and a beam diameter of a measurement apparatus used to measure the cross-sectional shape of the outermost sections is smaller than that used to measure the cross-sectional shape of the other section, thereby enabling highly precise measurement of the wafer shape up to its outermost circumference without reducing the productivity. The method also includes a step of determining polishing conditions of the first and second polishing steps in the subsequent polishing cycle on the basis of the flatness quantified from the shape measured with high precision, thereby enabling the improvement in the flatness of the entire wafer including the outermost circumference.

BRIEF DESCRIPTION OF DRAWINGS

FIG. 6 is a diagram showing the evaluation result of flatness $\alpha$ and $\beta$ in the first polishing cycle and the second polishing cycle in example;

DESCRIPTION OF EMBODIMENTS

Embodiments of the present invention will be hereinafter described, but the present invention is not limited to these embodiments.

As described previously, the flatness of the outer circumference, which is particularly important in recent years, needs to be improved. The present inventor diligently conducted study on this problem, and found the following.

Firstly, the inventor paid attention to a conventional method of evaluating the flatness of the outer circumference of a polished wafer: the shape of the outer circumference is measured in an optical manner within a measurement region excluding a region from the outer circumference to 2 mm away therefrom. The reason to exclude this region is that the measurement can prevent from being affected by a measuring laser beam reflected from the outer circumference, particularly a chamfered portion. The inventor found that the exclusion of this region from the measurement region is one cause to reduce the precision of the flatness measurement.

Secondly, the inventor considered a method to solve this problem and found the following:

The beam diameter of a measuring apparatus is changed according to a position at which the apparatus measures the cross-sectional shape of a wafer. More specifically, the cross-sectional shape of the outermost circumference of the wafer is measured with a measuring apparatus having a smaller beam diameter. This method can add the outermost circumference, which is conventionally an excluded region, to the measurement region in order to improve the measurement precision while preventing a large increase in measurement time, thereby enabling the shape to be measured up to the outermost circumference with high precision.

Finally, the inventor conceived the following:

In the shape measurement, a straight line extending from one outermost circumference of the wafer through the wafer center to the other outermost circumference is divided into prescribed sections; each of these sections is associated with a predetermined weight particularly in such a manner that as the section is closer to the wafer center, the weight is larger; the flatness is evaluated in every section to which the corresponding weight is added. This method can evaluate the flatness with higher precision. The evaluation result is used to determine the polishing conditions in the subsequent polishing cycle accordingly, thereby enabling the flatness of the entire wafer including the outermost circumference to be improved more effectively. The inventor thereby brought the invention to completion.

Figure 2:
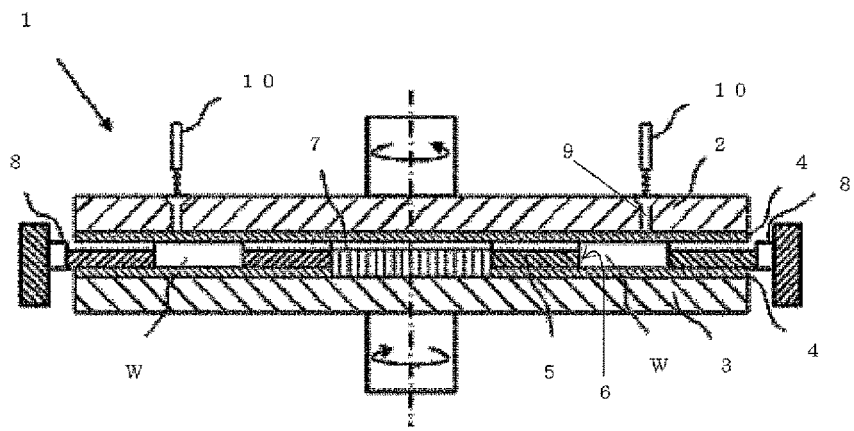
FIG. 2 is a schematic diagram of an exemplary double-side polishing apparatus that can be used for the inventive double-side polishing method.

A double-side polishing apparatus that can be used for the inventive double-side polishing method will now be described. As shown in FIG. 2, the double-side polishing apparatus 1 includes a cylindrical upper turn table 2 and a cylindrical lower turn table 3. Polishing pads 4 are attached to the upper and lower turn tables 2, 3 with each polishing surface thereof facing one another. The polishing pads 4 are made of a nonwoven fabric impregnated with a urethane resin, or urethane foam. A sun gear 7 is disposed inside the lower turn table 3. An internal gear 8 is disposed outside the lower turn table 3. The upper and lower turn tables 2, 3, the sun gear 7, and internal gear 8 have the same rotational axis, and can rotate independently about the axis.

The carrier 5 is provided with holding holes 6 to hold a wafer W. A plurality of the carriers 5 can be interposed between the upper and lower turn tables 2, 3. The holding holes 6 provided in each of the carriers 5 allow a plurality of wafers W to be polished in every polishing cycle. Each carrier 5 is engaged with the sun gear 7 and the internal gear 8 and capable of rotating about its axis and revolving around the above rotational axis between the upper and lower turn tables according to the rotational speed of the sun gear 7 and the internal gear 8. The wafers W are inserted and held in the holding holes 6 of the carriers 5. The upper turn table 2 is lowered to interpose the wafers W and the carriers 5 between the turn tables and thereby to apply a polishing load to the wafers W. The turn table 2 and the lower turn table 3 are rotated in an opposite direction while a polishing agent supplied from a nozzle 10 is poured into a space between the turn tables via through-holes 9 formed in the upper turn table 2, so that both surfaces of the wafer W are simultaneously polished.

The double-side polishing apparatus also includes a measuring apparatus for measuring the shape of the polished wafers taken out of the carriers, and a transfer robot for transferring the wafers to the measuring apparatus.

An exemplary measuring apparatus is an apparatus for measuring the thickness of a wafer with an infrared laser having a variable wavelength that is light transmittable through the wafer. The measuring apparatus can adjust the diameter of a laser beam to be emitted to the wafer.

The inventive double-side polishing method uses the double-side polishing apparatus of this type to polish wafers through a first polishing step at a high polishing rate and a subsequent second polishing step at a low polishing rate. The first polishing step removes process strain and pits produced on the wafer surface mostly by a previous process, and is performed with a high polishing load at a high polishing rate to improve the productivity. The second polishing step mostly adjusts the flatness, and is performed at a low polishing rate. The polishing conditions of these steps are determined properly on the basis of the evaluation result of the flatness in the previous polishing cycle. The above double-side polishing apparatus that can be used for the invention is described by way of example, and does not limit the invention.

The inventive double-side polishing method will now be described more specifically with reference to FIG. 1.

Figure 1:
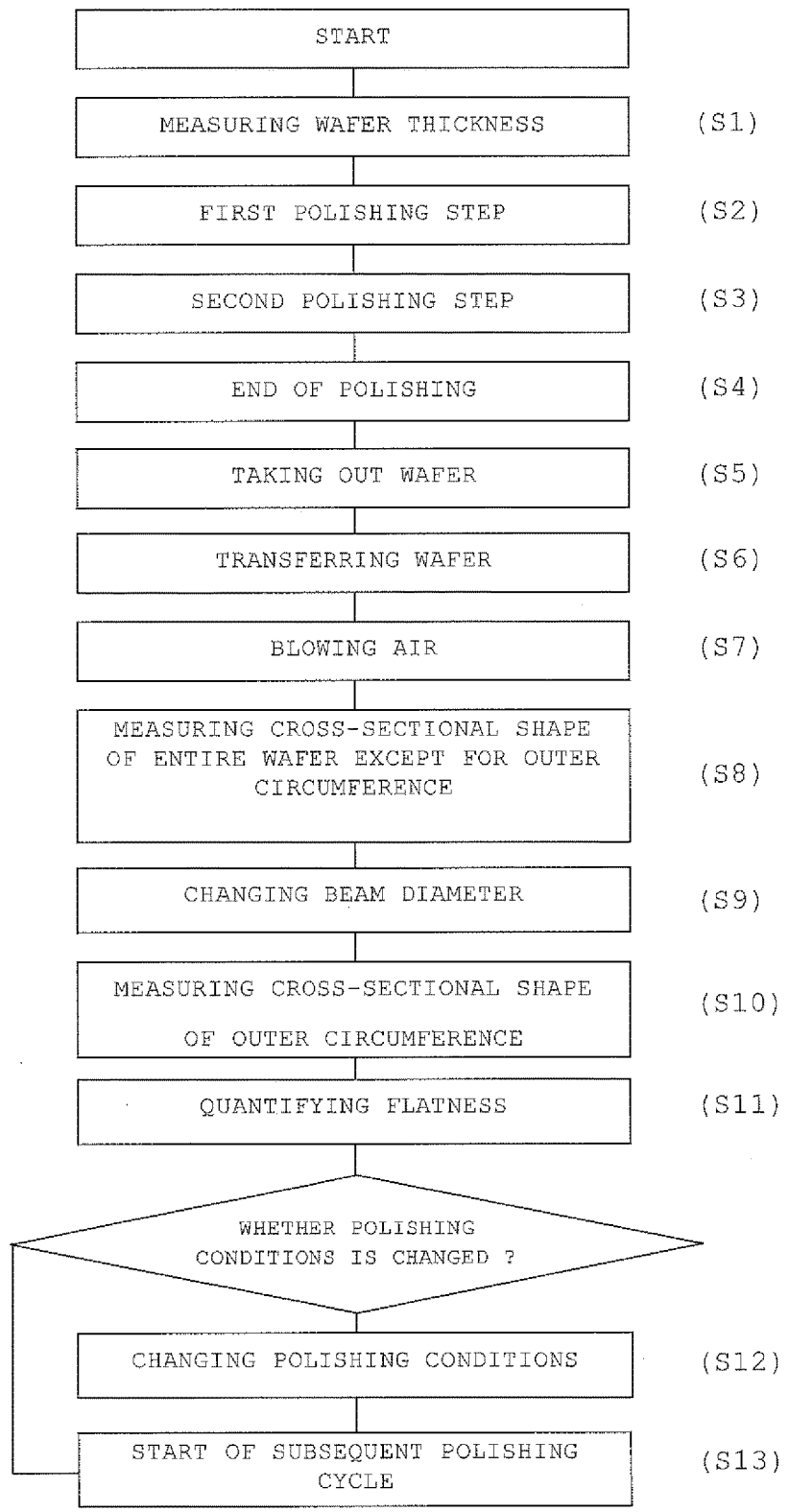
FIG. 1 is a flowchart of an example of the inventive double-side polishing method.

As shown in FIG. 1, a current polishing cycle begins while the thickness of wafer to be polished is measured (S1 in FIG. 1). The thickness of the wafers is preferably measured by the optical reflection interferometry with an infrared laser, which improves the measurement precision. In the polishing cycle, the first polishing step is first performed, as described above (S2 in FIG. 1). The polishing conditions of the first polishing step are determined in the previous polishing cycle, as described below.

The second polishing step is then performed (S3 in FIG. 1). The polishing conditions of the second polishing step are also determined in the previous polishing cycle, as described below. The second polishing step is finished when the thickness of the wafers reaches the target finishing thickness (S4 in FIG. 1). The polished wafers are taken out of the carriers (S5 in FIG. 1). At least one of the wafers is transferred to the measuring apparatus for measuring the cross-sectional shape of the wafer (S6 in FIG. 1). Before the measurement of the cross-sectional shape of the wafer, air is preferably blown to the wafer surface to remove the polishing agent and water adhering to the wafer (S7 in FIG. 1). This improves the measurement precision.

The cross-sectional shape of the polished wafer is then measured. In this measurement, the straight line extending from one outermost circumference of the wafer through the wafer center to the other outermost circumference is divided into prescribed sections, and the cross-sectional shape of the divided sections is optically measured. The measurement is made by two steps: measurement of the outermost sections; measurement of the other sections. The cross-sectional shape of the entire wafer except for the outermost sections is first measured (S8 in FIG. 1). In this measurement, the beam diameter of the measuring apparatus may be about 3 mm, which is the same as conventionally. This value however does not limit the invention. After this measurement, the beam diameter is changed into a smaller one to measure the cross-sectional shape of the outermost sections (S9 in FIG. 1). After the beam diameter is changed, the cross-sectional shape of the outermost sections is measured (S10 in FIG. 1).

The outermost section includes a part of the chamfered portion (a portion with chamfer width X1, X2 of the main surfaces of the wafer) of the wafer and the excluded outermost circumference of 2 mm. In the measurement of this section, which includes the 2-mm outermost circumference region and the part of the chamfered portion, use of the optical reflection interferometry with a beam diameter of 1 mm or less reduces the intensity of scattered light from the X1 and X2 portion of the chamfered portion to less than half of the incident beam, thereby allowing the reflection light to be reliably received from a portion from the outermost circumference to 1 mm away therefrom. This is preferred because the cross-sectional shape of the outer circumference can be measured stably. A beam diameter of about 0.06 mm is particularly preferable because this diameter provides a depth of focus of about 1.1 mm that makes an optical system for the measurement easy to adjust the focus regardless of variation in the wafer thickness, so the flatness of the outer circumference can readily be measured.

A beam diameter of 0.04 mm or less is unpractical because this diameter makes the optical system hard to adjust the focus.

The inventive method measures the shape of the outermost sections with the measurement apparatus having a beam diameter smaller than that used to measure the shape of the other sections, and can thereby accomplish the shape measurement up to the outermost circumference in a short time, thereby inhibiting reduction in the productivity. The method can also inhibit the influence of a laser beam reflected from the chamfered portion in the measurement, thereby improving the precision of the shape measurement.

Figure 3:
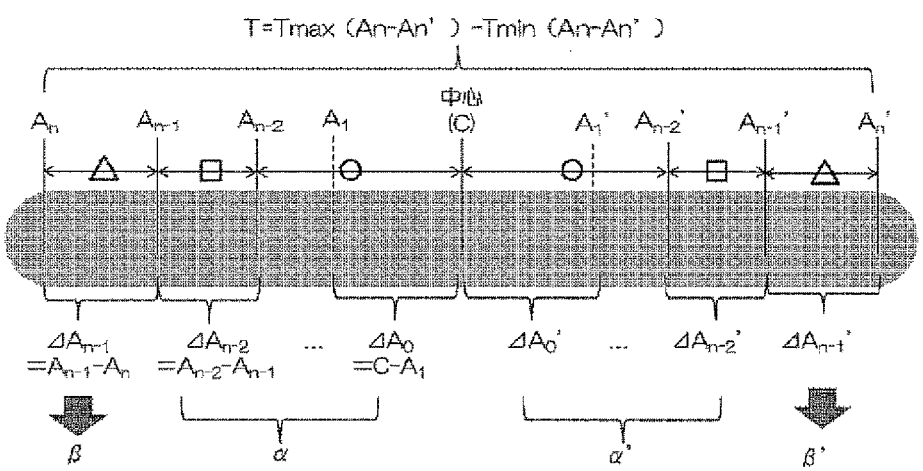
FIG. 3 is an explanatory view of an example of the division into sections and the quantification of flatness.

As shown in FIG. 3, the straight line, extending from one outermost circumference of the wafer through the wafer center, may be divided into the sections, for example, such that the sections are symmetrical about the wafer center. FIG. 3 denotes the position of the center of a wafer by C, the position of the outermost circumference of the wafer by n or n'. The value of n is an integer of 2 or more. The thickness of the wafer at the position n is denoted by $A_n$. In FIG. 3, the outermost sections are a section from n to n−1, and a section from n' to n−1'. An overall section except for the outermost sections is composed of sections from n−1 to n−1'.

The cross-sectional shape is preferably measured by the optical reflection interferometry with an infrared laser to improve the measurement precision. The measurement of the cross-sectional shape may be the measurement of wafer thickness.

Figure 4:
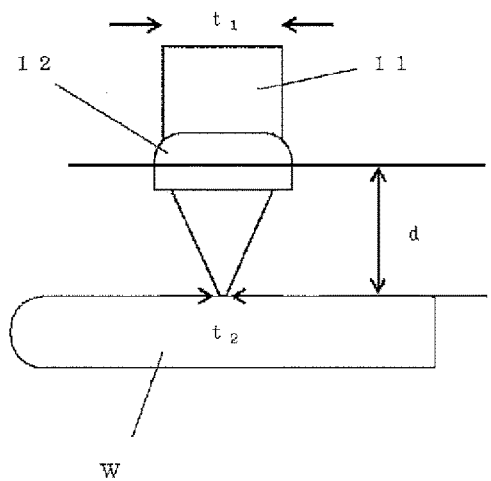
FIG. 4 is a schematic diagram of an exemplary method of changing the beam diameter of a measurement apparatus.

As shown in FIG. 4, for example, the beam diameter can be decreased from $t_1$ to $t_2$ by focusing a laser beam 11 with a focusing lens 12. If the beam diameter is 0.06 mm, then the depth of focus d is about 100 mm. This diameter makes it possible to reduce the size of the measuring apparatus and its cost.

The difference T ($T_{max}-T_{min}$) between the maximum thickness $T_{max}$ and the minimum thickness $T_{min}$ of the measured cross-sectional shape is then calculated. This cross-sectional shape corresponds to that of the sections between $A_n$ and $A_n'$ shown in FIG. 3. The weight, which is predetermined for each divided section, is applied to the measured cross-sectional shape to quantify the flatness of each section (S11 in FIG. 1). The flatness can be quantified, for example, from a difference ΔA in thickness of the wafer between at both ends of each divided section. The quantification will be described below with reference to FIG. 3.

The difference ($\Delta A_{n-1}$-$A_{n-1}$-$A_n$) in wafer thickness between at both ends n−1 and n of one outermost section is calculated. The difference ($\Delta A_{n-1'}=A_{n-1'}-A_{n'}$) in wafer thickness between at both ends n−1' and n' of the other outermost section symmetrical to this outermost section about the wafer center is also calculated. The flatness β of the outer circumference of the wafer is quantified from a larger value of absolute values of $\Delta A_{n-1}$ and $\Delta A_{n-1'}$. The value of the difference ΔA is negative when the outer circumference is in the form of a rise; the value of the difference ΔA is positive when the outer circumference is in the form of a sag.

The flatness α of the entire wafer except for the outer circumference is similarly quantified as follows: The difference in wafer thickness between at both ends of each section (from $\Delta A_{n-2}$ to $A_0$, and from $\Delta A_{n-2'}$ to $A_{0'}$) other than the outermost sections is calculated. The difference ΔA of each section is compared with that of the corresponding section symmetrical thereto about the wafer center. The difference ΔA of these sections is determined to be a larger value of absolute values of the compared differences. The weight, which is predetermined for each section, is applied to the difference ΔA of the corresponding section. The resultant difference ΔA of each section is added up. The flatness α of the entire wafer is the sum total of the added differences. The value of the difference ΔA is negative when the overall shape of the wafer is concave; the value of the difference ΔA is positive when the overall shape of the wafer is convex.

The weight may be predetermined, for example, such that as the section is closer to the center of the wafer, the weight is larger. Tables 1 and 2 show a specific example of the flatness obtained after weighting in the example shown in FIG. 3 where n=3, that is, where there are three pair of symmetric sections about the wafer center. Specifically, Table 1 shows exemplary quantified flatness of the outermost section. As shown in Table 1, when the shape is flat, the weight and the flatness are 0; when the shape is a rise or sag, the weight is 1; when the shape is a rise, the flatness is −1; when the shape is a sag, and the flatness is 1. These values can be regarded as the flatness β of the outer circumference.

Table 2 shows exemplary quantified flatness of section 1-2 (outside) and section C-1 (inside). In Table 2, the number of the symbol "+" of the concave and convex shapes represents the degree of the shapes, and the larger the number, the greater the degree. When the shape is flat, the weight and the flatness are 0; when the shape is a rise or sag, the weight for the section 1-2 is 0.5, and the flatness of this section is 0.5 when the shape is convex, or −0.5 when the shape is concave; when the shape is a rise or sag, the weight for the section C-1 is 1 or 2, the flatness of this section is 1 or 2 when the shape is convex, or −1 or −2 when the shape is concave. The flatness α of the entire wafer can be calculated from the flatness of the sections through the above described comparison and addition of the symmetric sections.

TABLE 1

| CROSS-SECTIONAL SHAPE | FLATNESS OF OUTERMOST SECTION (SECTION 2-3) |
|---|---|
| RISE | −1 |
| FLAT | 0 |
| SAG | 1 |

TABLE 2

| CROSS-SECTIONAL SHAPE | FLATNESS OF SECTION 1-2 | FLATNESS OF SECTION C-1 |
|---|---|---|
| CONVEX++ | 0.5 | 2 |
| CONVEX+ |  | 1 |
| FLAT | 0 | 0 |
| CONCAVE+ | −0.5 | −1 |
| CONCAVE++ |  | −2 |

The polishing conditions of the first and second polishing steps in the subsequent polishing cycle are determined on the basis of the above quantified flatness (S12 in FIG. 1). These conditions can be determined such that both the first and second polishing steps polish the wafer so as to have the respective target thicknesses by adjusting at least one of the polishing load, the rotational speed and the revolution speed of the carrier, and the rotational speed of the upper and lower turn tables. These target thicknesses of the wafer after the respective polishing steps can be determined for example as follows.

The target wafer thickness of the first polishing step in the subsequent polishing cycle is calculated by multiplying the obtained flatness β of the outer circumference by the difference T between the maximum wafer thickness and the minimum wafer thickness and adding the resultant to the target thickness in the current polishing cycle. When the shape of the outer circumference is a rise, for example, since the value of β is negative, adding the value of β×T to the target thickness in the current polishing cycle results in a decrease in the target thickness. The target thickness can be decreased by increasing the polishing load, or increasing the rotational speed of the turn tables and the rotational speed and the revolution speed of the carrier to increase the polishing rate. When the shape of the outer circumference is a sag, since the value of β is positive, adding the value of β×T to the target thickness in the current polishing cycle results in an increase in the target thickness. The target thickness can be increased by decreasing the polishing load, or decreasing the rotational speed of the turn tables and the rotational speed and the revolution speed of the carrier to decrease the polishing rate.

Figure 5:
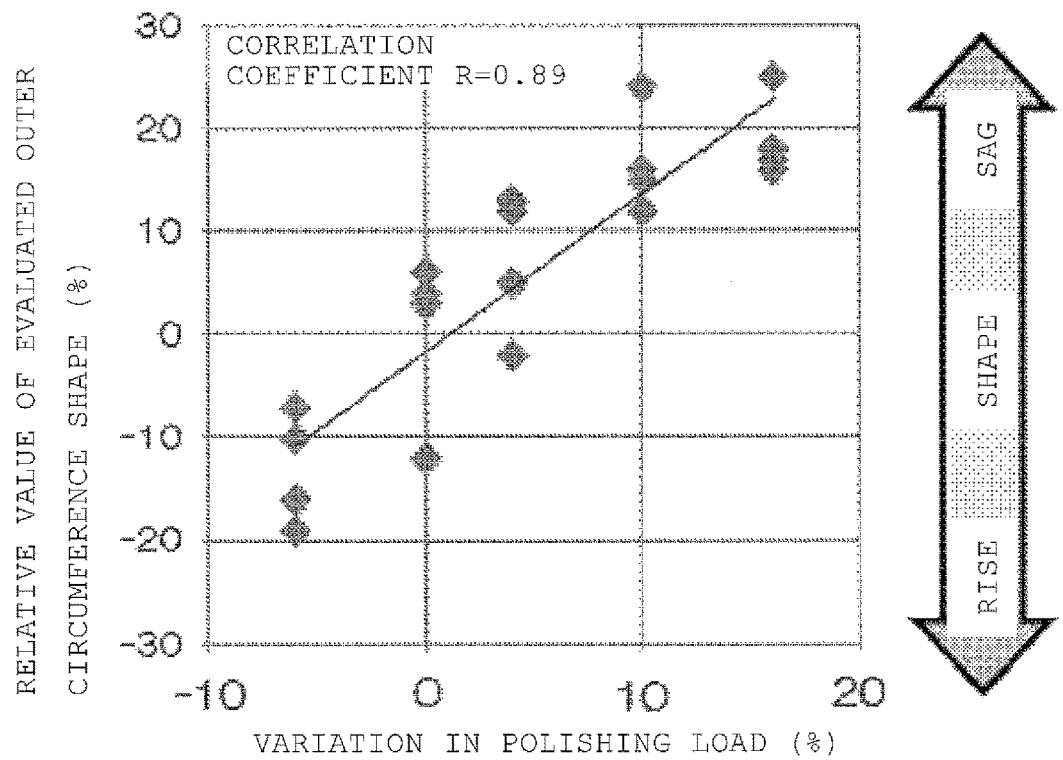
FIG. 5 is a diagram showing the relationship between a polishing load and the shape of the outer circumference of a wafer.

FIG. 5 shows the result of the evaluation of variation in shape of the wafer outer circumference in an example in which the polishing load is changed. As shown in FIG. 5, as the polishing load increases, the shape of the outer circumference tends to be a sag; as the polishing load decreases, the shape of the outer circumference tends to be a rise. The shape of the outer circumference can accordingly be adjusted by changing the polishing load on the basis of this relationship.

The target wafer thickness of the second polishing step in the subsequent polishing cycle is calculated by subtracting the flatness α of the entire wafer from the target thickness in the current polishing cycle. When the flatness of the entire wafer is concave, for example, since the value of a is negative, subtracting the flatness α of the entire wafer×T from the target thickness in the current polishing cycle results in an increase in the target thickness. When the flatness of the entire wafer is convex, since the value of α is positive, subtracting the flatness α of the entire wafer×T from the target thickness in the current polishing cycle results in a decrease in the target thickness. In these cases, the polishing load, the rotational speed of the turn tables and the rotational speed, and the revolution speed of the carrier may be adjusted in the same manner as above.

Lastly, the subsequent polishing cycle is performed under the above determined polishing conditions (S13 in FIG. 1). The method can use a control device to automatically perform the quantification of the flatness from the measured cross-sectional shape and the determination of the polishing conditions on the basis of the quantified flatness, which improves the productivity.

The inventive double-side polishing method can measure the shape of the polished wafer up to the outer circumference with high precision and improve the flatness of the entire wafer including the outermost circumference by accurately use the flatness, which is quantified from this measured shape, in the subsequent polishing cycle. This method can also prevent an increase in the measurement time, thereby inhibiting reduction in the productivity.

EXAMPLE

The present invention will be more specifically described with reference to an example and a comparative example, but the present invention is not limited to this example.

Example

A 300-mm-diameter silicon single crystal wafer was double-polished according to the inventive double-side polishing method shown in FIG. 1. This example began with the preparation of wafers by slicing a silicon single crystal ingot grown by the Czochralski (CZ) method into wafers and chamfering, lapping, and etching the wafers. The polishing was performed with a double-side polishing apparatus shown in FIG. 2. The double-side polishing apparatus used urethane foam polishing pads on both sides of the upper and lower turn tables, and a polishing agent containing colloidal silica grains whose its pH was adjusted in the range between 10.0 and 11.0.

The polishing conditions of the first polishing step in the first polishing cycle were as follows: the polishing load was 150 g/cm$^2$; the rotational speeds of the upper and lower turn tables and the sun and internal gears were determined such that the difference between the revolution speed of the carrier and the rotational speed of the upper turn table, and the difference between the rotational speed of the lower turn table and the revolution speed of the carrier were 10 rpm; the rotational speed of the carrier was 2.5 rpm; the target thickness of the first polishing step was 785 μm; the target thickness of the second polishing step, the finishing thickness, was 780 μm.

After the first polishing cycle, the flatness was evaluated. The result was that the shape of the outer circumference was a rise, and the overall shape was concave. The values decided as shown in FIG. 6 at (A) were used to determine the polishing conditions in the second polishing cycle as follows: the polishing load of the first polishing step was increased to decrease the target thickness to 784.909 μm (785 μm+β(−1)×T(0.091)). The polishing load of the second polishing step was decreased to increase the target thickness to 780.136 μm (780 μm−α(−1.5)×T(0.091)).

After the second polishing cycle, the flatness was evaluated. The result was that, as shown in FIG. 6 at (B), the flatness of the entire wafer including the outermost circumference was improved.

The beam diameter of the measuring apparatus used for the measurement of the outermost sections was 0.06 mm.

Figure 7:
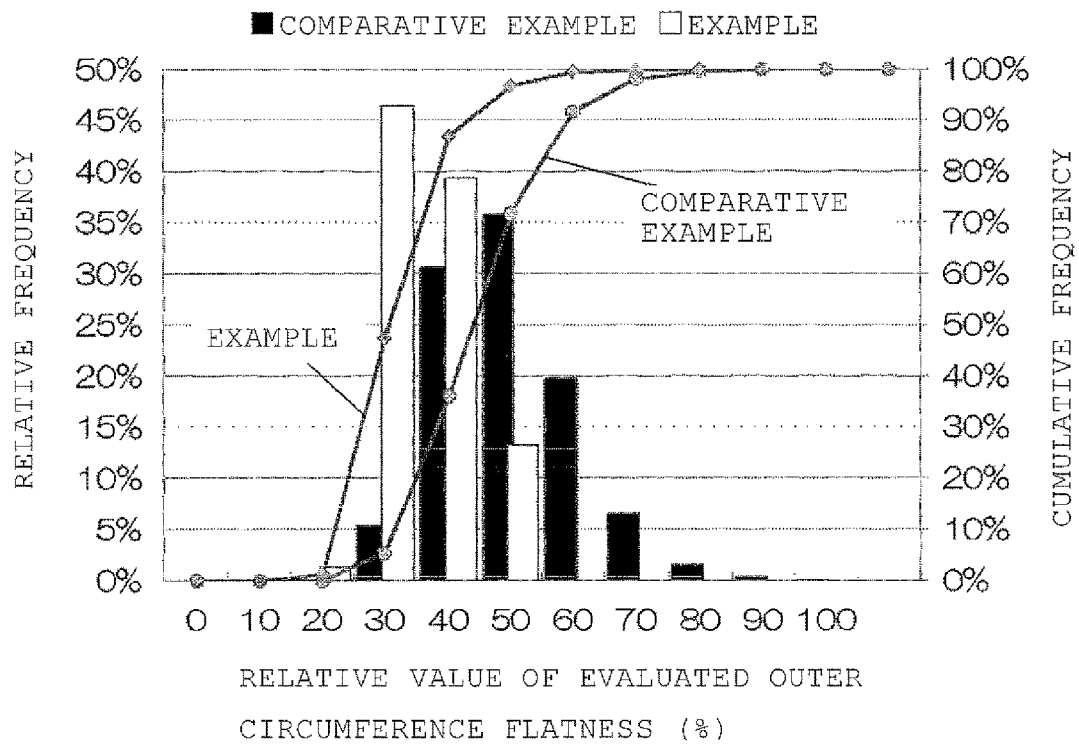
FIG. 7 is a diagram showing the evaluation result of flatness of the outer circumference of polished wafers in example and comparative example.
Figure 8:
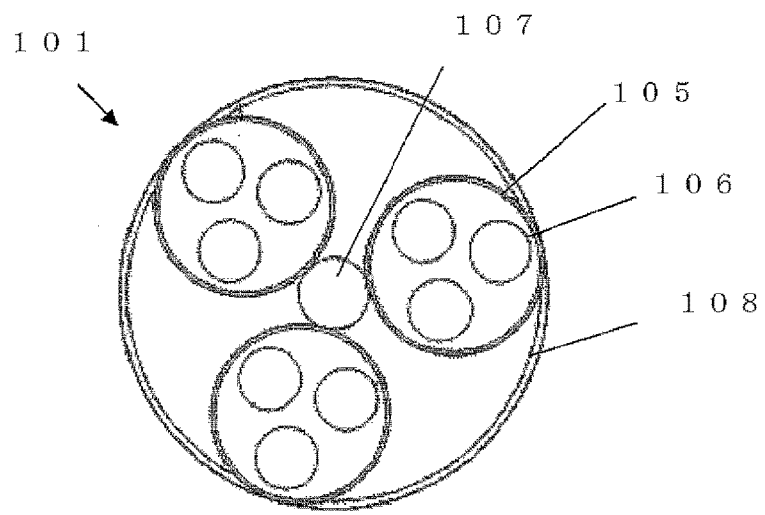
FIG. 8 is a schematic diagram of a common double-side polishing apparatus of a planetary gear type.

The above polishing cycle was repeated to evaluate the flatness of the outer circumference of the polished wafers. The result is given in FIG. 7. The relative value of the evaluated outer circumference flatness is a value converted from a standard value ranging from 0 to 100, and a value closer to 0 represents better flatness. As shown in FIG. 7, it was confirmed that the flatness in example was improved more than that in comparative example.

Comparative Example

The polishing cycle was repeated under the same conditions to make the same evaluation as in example except that the polishing conditions were not changed after each polishing cycle.

The result of the evaluated flatness of the outer circumference of the polished wafers is given in Table 7. As shown in FIG. 7, the flatness became worse than that of example.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A double-side polishing method comprising a polishing cycle that comprises:
    performing a first polishing step of carrying out a double-side polishing process at a high polishing rate, the double-side polishing process simultaneously polishing both surfaces of a wafer that is held with a carrier and interposed between polishing pads each attached on upper and lower turn tables while rotating and revolving the carrier, supplying a polishing agent, and measuring a thickness of the wafer;
    performing a second polishing step of carrying out the double-side polishing process at a low polishing rate,
    dividing a straight line extending from one outermost circumference of the polished wafer through a center of the polished wafer to another outermost circumference into prescribed sections, and optically measuring a cross-sectional shape of the divided sections;
    applying a weight predetermined for each divided section to the measured cross-sectional shape to quantify flatness of each section; and
    determining polishing conditions of the first and second polishing steps in a subsequent polishing cycle on a basis of the quantified flatness, wherein
    a beam diameter of a measurement apparatus used to measure the cross-sectional shape of outermost sections is smaller than that used to measure the cross-sectional shape of the other section.

2. The double-side polishing method according to claim 1, wherein the step of determining polishing conditions of the first and second polishing steps includes adjusting at least one of a polishing load, a rotational speed and a revolution speed of the carrier, and a rotational speed of the upper and lower turn tables such that the thickness of the wafer subjected to the first and second polishing steps becomes a target thicknesses.

3. The double-side polishing method according to claim 1, wherein the beam diameter of the measurement apparatus used to measure the cross-sectional shape of the outermost sections is 1 mm or less.

4. The double-side polishing method according to claim 2, wherein the beam diameter of the measurement apparatus used to measure the cross-sectional shape of the outermost sections is 1 mm or less.

5. The double-side polishing method according to claim 1, wherein the cross-sectional shape is measured by optical reflection interferometry with an infrared laser.

6. The double-side polishing method according to claim 2, wherein the cross-sectional shape is measured by optical reflection interferometry with an infrared laser.

7. The double-side polishing method according to claim 3, wherein the cross-sectional shape is measured by optical reflection interferometry with an infrared laser.

8. The double-side polishing method according to claim 4, wherein the cross-sectional shape is measured by optical reflection interferometry with an infrared laser.

9. The double-side polishing method according to claim 1, wherein
    the step of measuring the cross-sectional shape includes:
        dividing the line such that the prescribed sections are symmetrical about the center of the wafer; calculating a difference $\Delta A$ in thickness of the wafer between at both ends of each section;
        comparing the difference $\Delta A$ of each section with that of the corresponding symmetrical section about the center of the wafer and determining that the difference of the corresponding sections is a larger value of absolute values of the compared differences, and
    the step of quantifying the flatness includes:
        quantifying flatness $\beta$ of an outer circumference of the wafer from the difference $\Delta A$ of the outermost sections; quantifying flatness $\alpha$ of the entire wafer except for the outer circumference by applying each weight to the difference $\Delta A$ of the corresponding section such that, as the section is closer to the center of the wafer, the weight is larger, and adding up the difference $\Delta A$ of the sections other than the outermost sections.

10. The double-side polishing method according to claim 2, wherein
    the step of measuring the cross-sectional shape includes:
        dividing the line such that the prescribed sections are symmetrical about the center of the wafer; calculating a difference $\Delta A$ in thickness of the wafer between at both ends of each section;
        comparing the difference $\Delta A$ of each section with that of the corresponding symmetrical section about the center of the wafer and determining that the difference of the corresponding sections is a larger value of absolute values of the compared differences, and
    the step of quantifying the flatness includes:
        quantifying flatness $\beta$ of an outer circumference of the wafer from the difference $\Delta A$ of the outermost sections; quantifying flatness $\alpha$ of the entire wafer except for the outer circumference by applying each weight to the difference $\Delta A$ of the corresponding section such that, as the section is closer to the center of the wafer, the weight is larger, and adding up the difference $\Delta A$ of the sections other than the outermost sections.

11. The double-side polishing method according to claim 3, wherein
    the step of measuring the cross-sectional shape includes:
        dividing the line such that the prescribed sections are symmetrical about the center of the wafer; calculating a difference $\Delta A$ in thickness of the wafer between at both ends of each section;
        comparing the difference $\Delta A$ of each section with that of the corresponding symmetrical section about the center of the wafer and determining that the difference of the corresponding sections is a larger value of absolute values of the compared differences, and the step of quantifying the flatness includes:
quantifying flatness β of an outer circumference of the wafer from the difference ΔA of the outermost sections; quantifying flatness α of the entire wafer except for the outer circumference by applying each weight to the difference ΔA of the corresponding section such that, as the section is closer to the center of the wafer, the weight is larger, and adding up the difference ΔA of the sections other than the outermost sections.

12. The double-side polishing method according to claim 4, wherein
the step of measuring the cross-sectional shape includes:
dividing the line such that the prescribed sections are symmetrical about the center of the wafer; calculating a difference ΔA in thickness of the wafer between at both ends of each section;
comparing the difference ΔA of each section with that of the corresponding symmetrical section about the center of the wafer and determining that the difference of the corresponding sections is a larger value of absolute values of the compared differences, and
the step of quantifying the flatness includes:
quantifying flatness β of an outer circumference of the wafer from the difference ΔA of the outermost sections; quantifying flatness α of the entire wafer except for the outer circumference by applying each weight to the difference ΔA of the corresponding section such that, as the section is closer to the center of the wafer, the weight is larger, and adding up the difference ΔA of the sections other than the outermost sections.

13. The double-side polishing method according to claim 5, wherein
the step of measuring the cross-sectional shape includes:
dividing the line such that the prescribed sections are symmetrical about the center of the wafer; calculating a difference ΔA in thickness of the wafer between at both ends of each section;
comparing the difference ΔA of each section with that of the corresponding symmetrical section about the center of the wafer and determining that the difference of the corresponding sections is a larger value of absolute values of the compared differences, and
the step of quantifying the flatness includes:
quantifying flatness β of an outer circumference of the wafer from the difference ΔA of the outermost sections; quantifying flatness α of the entire wafer except for the outer circumference by applying each weight to the difference ΔA of the corresponding section such that, as the section is closer to the center of the wafer, the weight is larger, and adding up the difference ΔA of the sections other than the outermost sections.

14. The double-side polishing method according to claim 6, wherein
the step of measuring the cross-sectional shape includes:
dividing the line such that the prescribed sections are symmetrical about the center of the wafer; calculating a difference ΔA in thickness of the wafer between at both ends of each section;
comparing the difference ΔA of each section with that of the corresponding symmetrical section about the center of the wafer and determining that the difference of the corresponding sections is a larger value of absolute values of the compared differences, and
the step of quantifying the flatness includes:
quantifying flatness β of an outer circumference of the wafer from the difference ΔA of the outermost sections; quantifying flatness α of the entire wafer except for the outer circumference by applying each weight to the difference ΔA of the corresponding section such that, as the section is closer to the center of the wafer, the weight is larger, and adding up the difference ΔA of the sections other than the outermost sections.

15. The double-side polishing method according to claim 7, wherein
the step of measuring the cross-sectional shape includes:
dividing the line such that the prescribed sections are symmetrical about the center of the wafer; calculating a difference ΔA in thickness of the wafer between at both ends of each section;
comparing the difference ΔA of each section with that of the corresponding symmetrical section about the center of the wafer and determining that the difference of the corresponding sections is a larger value of absolute values of the compared differences, and
the step of quantifying the flatness includes:
quantifying flatness β of an outer circumference of the wafer from the difference ΔA of the outermost sections; quantifying flatness α of the entire wafer except for the outer circumference by applying each weight to the difference ΔA of the corresponding section such that, as the section is closer to the center of the wafer, the weight is larger, and adding up the difference ΔA of the sections other than the outermost sections.

16. The double-side polishing method according to claim 8, wherein
the step of measuring the cross-sectional shape includes:
dividing the line such that the prescribed sections are symmetrical about the center of the wafer; calculating a difference ΔA in thickness of the wafer between at both ends of each section;
comparing the difference ΔA of each section with that of the corresponding symmetrical section about the center of the wafer and determining that the difference of the corresponding sections is a larger value of absolute values of the compared differences, and
the step of quantifying the flatness includes:
quantifying flatness β of an outer circumference of the wafer from the difference ΔA of the outermost sections; quantifying flatness α of the entire wafer except for the outer circumference by applying each weight to the difference ΔA of the corresponding section such that, as the section is closer to the center of the wafer, the weight is larger, and adding up the difference ΔA of the sections other than the outermost sections.

17. The double-side polishing method according to claim 9, wherein
the flatness α of the entire wafer is quantified in such a manner that the flatness α of the section closest to the center of the wafer is converted to 0 if the difference ΔA is 0, 1 or 2 if the difference ΔA is positive, −1 or −2 if the difference ΔA is negative; the flatness α of the other section is converted to 0 if the difference ΔA is 0, 0.5 if the difference ΔA is positive, −0.5 if the difference ΔA is negative; and the difference ΔA of each section is then added up,
the flatness β of the outer circumference of the wafer is quantified in such a manner that the flatness β is 0 if the difference ΔA is 0, 1 if the difference ΔA is positive, −1 if the difference ΔA is negative, and
the step of determining polishing conditions of the first and second polishing steps includes determining the target thickness of the wafer to be polished in the first polishing step to be performed in the subsequent polishing cycle by adding β×T to the target thickness in a current polishing cycle, and determining the target thickness of the wafer to be polished in the second polishing step to be performed in the subsequent polishing cycle by subtracting α×T from the target thickness in the current polishing cycle, where T is a difference between the maximum thickness and the minimum thickness of the wafer.

18. The double-side polishing method according to claim 16, wherein the flatness α of the entire wafer is quantified in such a manner that the flatness α of the section closest to the center of the wafer is converted to 0 if the difference ΔA is 0, 1 or 2 if the difference ΔA is positive, −1 or −2 if the difference ΔA is negative; the flatness α of the other section is converted to 0 if the difference ΔA is 0, 0.5 if the difference ΔA is positive, −0.5 if the difference ΔA is negative; and the difference ΔA of each section is then added up, the flatness β of the outer circumference of the wafer is quantified in such a manner that the flatness β is 0 if the difference ΔA is 0, 1 if the difference ΔA is positive, −1 if the difference ΔA is negative, and the step of determining polishing conditions of the first and second polishing steps includes determining the target thickness of the wafer to be polished in the first polishing step to be performed in the subsequent polishing cycle by adding β×T to the target thickness in a current polishing cycle, and determining the target thickness of the wafer to be polished in the second polishing step to be performed in the subsequent polishing cycle by subtracting α×T from the target thickness in the current polishing cycle, where T is a difference between the maximum thickness and the minimum thickness of the wafer.

19. The double-side polishing method according to claim 1, further comprising:

taking the wafer out of the carrier after the second polishing step, and then blowing air to a surface of the wafer taken out of the carrier before the step of measuring the cross-sectional shape.

20. The double-side polishing method according to claim 18, further comprising:

taking the wafer out of the carrier after the second polishing step, and then blowing air to a surface of the wafer taken out of the carrier before the step of measuring the cross-sectional shape.

* * * * *